United States Patent [19]

Senda et al.

[11] Patent Number: 5,197,170
[45] Date of Patent: Mar. 30, 1993

[54] METHOD OF PRODUCING AN LC COMPOSITE PART AND AN LC NETWORK PART

[75] Inventors: Atsuo Senda, Otsu; Osamu Kano, Nagaokakyo; Yasuo Fujiki, Takefu, all of Japan

[73] Assignee: Murata Manufacturing Co., Ltd., Kyoto, Japan

[21] Appl. No.: 613,071

[22] Filed: Nov. 15, 1990

[30] Foreign Application Priority Data

Nov. 18, 1989 [JP] Japan ............................. 1-300593
Nov. 18, 1989 [JP] Japan ............................. 1-300594

[51] Int. Cl.⁵ ......................... C04B 37/00; B23B 31/00
[52] U.S. Cl. ................................ 29/25.42; 29/602.1; 156/89; 156/250; 156/630; 156/664; 427/116; 427/123; 427/125
[58] Field of Search ................ 156/89, 250, 630, 664; 29/602.1, 25.42; 427/116, 123, 125

[56] References Cited

U.S. PATENT DOCUMENTS 4,746,557  5/1988  Sakamoto et al. .................. 428/138
5,006,182  4/1991  Gantzhorn, Jr. et al. ............ 156/89

Primary Examiner—Jan H. Silbaugh
Assistant Examiner—Christopher A. Fiorilla
Attorney, Agent, or Firm—Burns, Doane, Swecker & Mathis

[57] ABSTRACT

A process of forming an LC composite part. The process includes the steps of: forming a substrate having a capacitor section by laminating ceramic sheets having a plurality of capacitor electrodes formed thereon such that the ceramic sheets and electrode layers alternate, sintering the substrate, forming a plurality of coil sections on the sintered substrate, cutting the substrate into composite parts, and electrically connecting the capacitor electrode layers with the coil section.

16 Claims, 7 Drawing Sheets

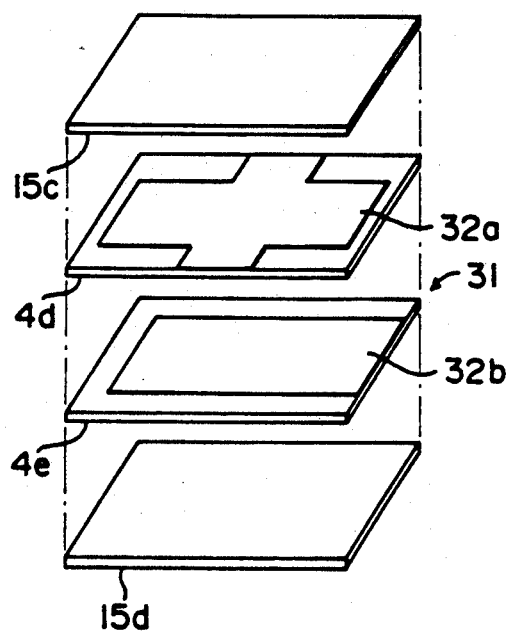
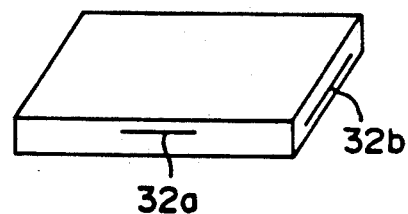
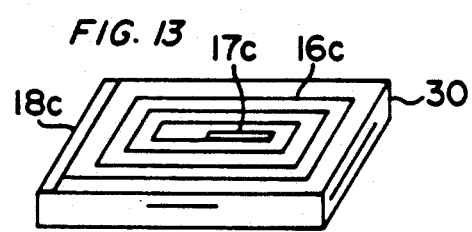
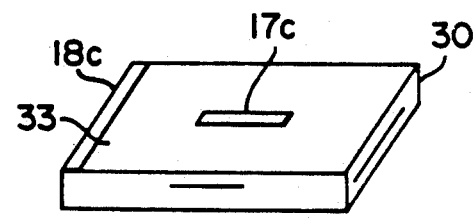
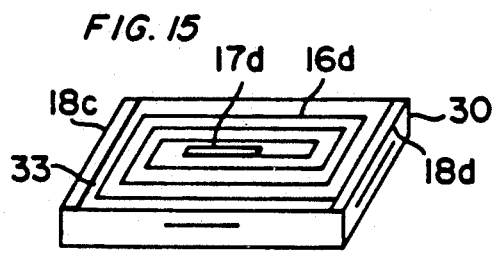
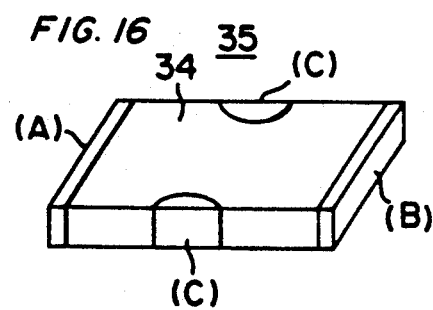
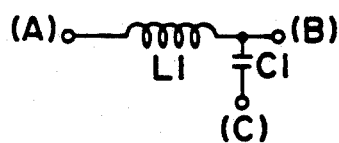

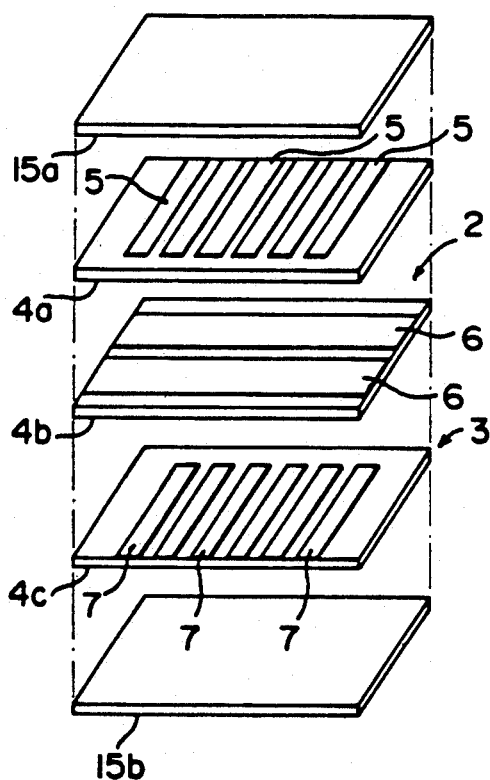
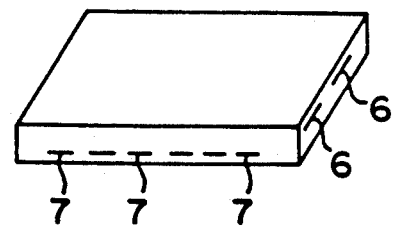
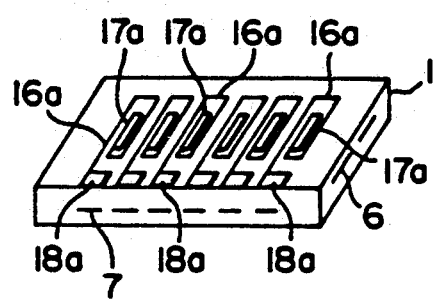
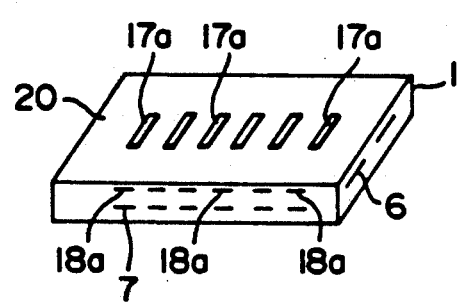

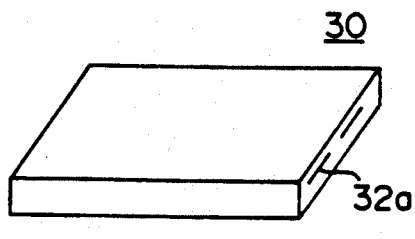
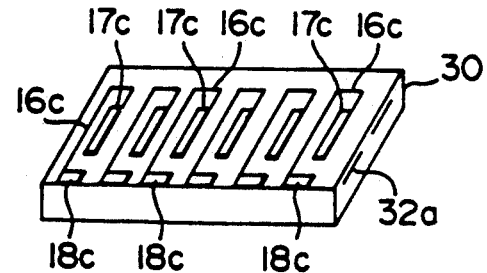
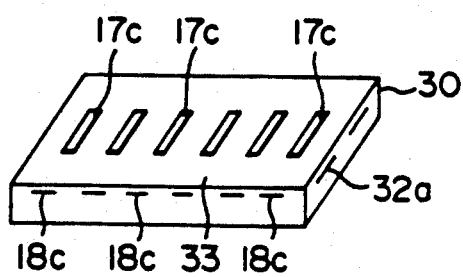
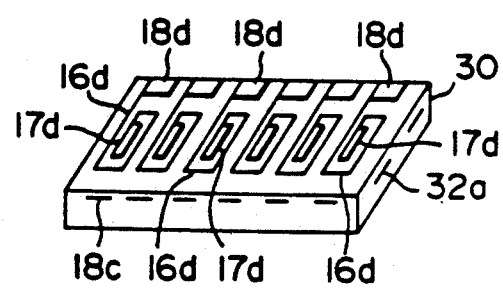
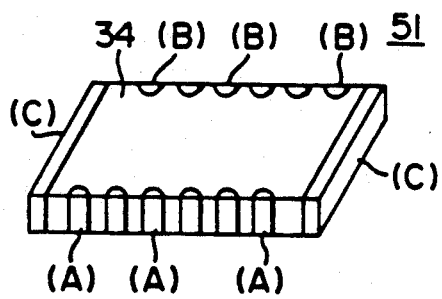
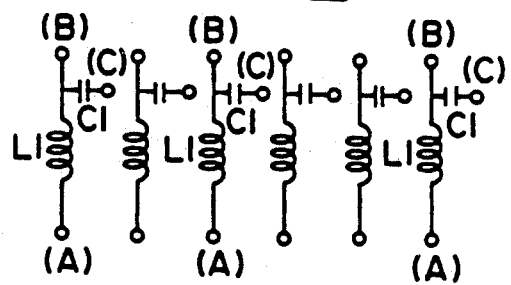

METHOD OF PRODUCING AN LC COMPOSITE PART AND AN LC NETWORK PART

BACKGROUND OF THE INVENTION

1. Field of the Invention

The Present invention relates to a method of producing a chip type LC composite part and a chip type LC composite network part to be used as noise filters, etc.

2. Description of Related Art

For producing a chip type LC composite part, there are conventionally two methods: sheet lamination method and LC coupling method. In the sheet lamination method, a capacitor section made of a dielectric material and a coil section made of a magnetic material are laminated into an unsintered substrate, and the laminated substrate is divided into pieces each of which will be made into a product. Each of the laminated pieces is sintered, and external electrodes are formed on the sintered piece. However, since the sintering contraction rate of the dielectric material differs from that of the magnetic material, when the capacitor section and the coil section are sintered together, there is a fear that the capacitor section and the coil section may be disconnected from each other, or may have distortion and cracks. For the reasons, complicated production control has been required.

In the LC coupling method, a capacitor section and a coil section which were sintered separately are connected together by brazing or soldering, and the integrated body is subject to a molding process. The LC coupling method includes more production processes than the sheet lamination method, which results in increase in production cost.

Since the arrangement of components is more dense and wiring has a narrower pattern pitch recently, there is a growing demand for LC composite network parts which can cope with a narrower pattern pitch. However, an LC composite network part which can cope with a narrower pattern pitch has been conventionally formed of a capacitor section and a coil section. Therefore it has been required to connect the sections via a connector, and there has been a problem that a large space is required for mounting the part on a circuit board.

SUMMARY OF THE INVENTION

It is therefore an object of the present invention to provide a method of producing, at low cost, an LC composite part which requires fewer production processes.

Another object of the present invention is to provide a method of producing, at low cost, an LC composite network part which can cope with a narrower pattern pitch and requires fewer production processes.

In order to achieve the objects above, a method of producing an LC composite part according to the present invention comprises the steps of: forming a substrate having a capacitor section including a plurality of capacitor units by alternately laminating a ceramic layer and a capacitor electrode layer; sintering the substrate; forming a coil section including a plurality of spiral coil patterns on the sintered substrate; dividing the laminated substrate having the capacitor section and the coil section into LC composite parts; and connecting the capacitor electrode with the spiral coil pattern by electrical connection means in each of the LC composite parts.

In the method of producing an LC composite part, since a substrate having a plurality of coils and capacitors is subject to multiple processes until the last process, no complicated operation is required and the number of production processes is reduced. Further, since the capacitor section made of ceramics is sintered in an early stage, the capacitor section is easy to handle in many processes. Also, the sintered substrate has great mechanical strength, which results in minimizing the possibility that the substrate may have chips and scratches during the processes. When a photoetching method is applied to forming the coil section on the surface of the sintered capacitor section, the coil section does not need to be exposed to heat. Thus, the coil section and the capacitor are connected to each other without a fear of being disconnected or having distortion and cracks.

A method of producing an LC composite network part according to the present invention comprises the steps of: forming a substrate having a capacitor section including a capacitor network by alternately laminating a ceramic layer and a capacitor electrode layer; sintering the substrate; forming a coil section having a coil network including a plurality of spiral coil patterns on the sintered substrate; dividing the laminated substrate having the capacitor section and the coil section into LC composite network parts; and connecting the capacitor electrode with the spiral coil pattern by electrical connection means in each of the LC composite network parts.

An LC composite network part produced in the method can be applied to a circuit having a narrower pattern pitch. In using the LC composite network part, connecting operation of capacitors and coils with a connector, which has been required in using a conventional one, is not necessary any more, and the space required for mounting the LC composite network part on a circuit board becomes smaller. The method of producing an LC composite network part has the merits as described with reference to the method of producing an LC composite part.

Furthermore, when using the sintered capacitor substrate, it is possible to know the capacitance beforehand and further possible to set the inductance of the coil in accordance with the targeted accuracy, and thus precision composite parts can be manufactured. It is therefore possible to use an LC composite part or an LC composite network part produced in the methods according to the present invention as a band pass filter and a high pass filter which requires high precision parts.

BRIEF DESCRIPTION OF THE DRAWINGS

These and other objects and features of the present invention will become apparent from the following description taken in conjunction with preferred embodiments thereof with reference to the accompanying drawings, in which:

FIG. 1 is an exploded view of a substrate;

FIG. 2 is a perspective view of the substrate;

FIG. 3, 4, 5 and 6 are perspective views of the substrate showing a process of forming a coil section;

FIG. 7 is a perspective view of an LC composite part cut off from the substrate;

FIG. 8 is a perspective view of a finished LC composite part;

FIG. 9 is the electrical equivalent circuit of the finished LC composite part;

FIG. 10 is a perspective view of a substrate showing a modification of spiral coil patterns;

FIGS. 11 through 17 show a second embodiment of the present invention;

FIG. 11 is an exploded view of a substrate;

FIG. 12 is a perspective view of the substrate;

FIG. 13, 14 and 15 are perspective views of the substrate showing a process of forming a coil section;

FIG. 16 is a perspective view of a finished LC composite part;

FIG. 17 is the electrical equivalent circuit of the finished LC composite part;

FIGS. 18 through 24 show a third embodiment of the present invention;

FIG. 18 is an exploded view of a substrate;

FIG. 19 is a perspective view of the substrate;

FIG. 20, 21 and 22 are perspective views of the substrate showing a process of forming a coil section;

FIG. 23 is a perspective view of a finished LC composite network part;

FIG. 24 is the electrical equivalent circuit of the finished LC composite network part;

FIGS. 25 through 31 show a fourth embodiment of the present invention;

FIG. 25 is an exploded view of a substrate;

FIG. 26 is a perspective view of the substrate;

FIGS. 27, 28 and 29 are perspective views of the substrate showing a process of forming a coil section;

FIG. 30 is a perspective view of a finished LC composite network part;

FIG. 31 is the electrical equivalent circuit of the finished LC composite network part;

DETAILED DESCRIPTION OF THE PREFERRED EMBODIMENTS

The following describes methods of producing an LC composite part and an LC composite network part embodying the principles and features of the present invention with reference to the accompanying drawings

FIRST EMBODIMENT: FIGS. 1 THROUGH 10

Figure 1:
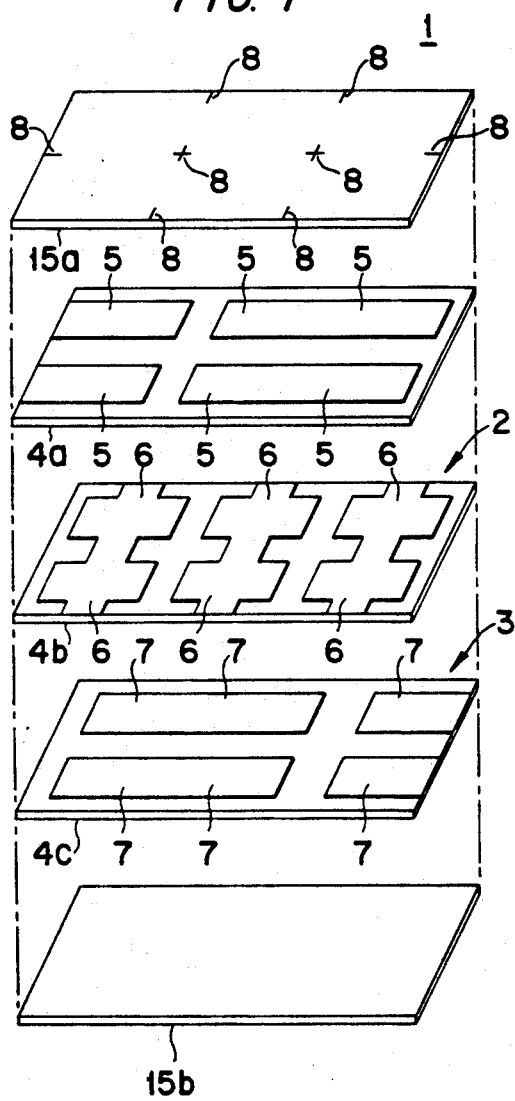
FIGS. 1 through 10 show a first embodiment of the present invention.

Described in the first embodiment is a method of producing a $\pi$ type noise filter having one coil and two laminate capacitors. Referring to FIG. 1, a substrate 1 carries laminate capacitors corresponding to six $\pi$ type noise filters. The substrate 1 is laminated with capacitor sections 2 and 3, and insulating sheets 15a and 15b are laminated on the upper surface of the capacitor section 2 and the lower surface of the capacitor section 3 respectively.

Figure 2:
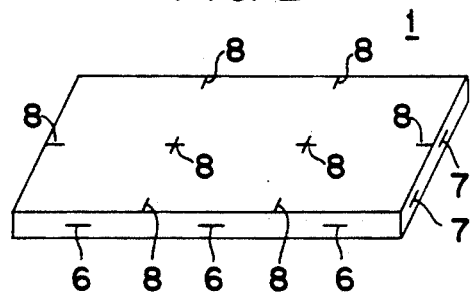

Each of the capacitor sections 2 and 3 includes six laminate capacitors. The capacitor sections 2 and 3 are composed of ceramic sheets 4a, 4b and 4c and capacitor electrodes 5, 6 and 7 formed on the respective ceramic sheets 4a, 4b and 4c. The ceramic sheets 4a, 4b and 4c are produced by mixing a dielectric material powder such as BaTiO with a resin binder and forming the mixture in sheets. The capacitor electrodes 5, 6 and 7 are made of Ag-Pd electrically conductive paste or the like and formed in a printing method or the like. The electrodes 6 formed on the ceramic sheet 4b serve as common electrodes, and in a laminate construction, an electrostatic capacitance C1 is formed between each pair of the capacitor electrodes 5 and the capacitor electrodes 6, while an electrostatic capacitance C2 is formed between each pair of the capacitor electrodes 6 and the capacitor electrodes 7. As shown in FIG. 2, the capacitor sections 2 and 3 are laminated together with the insulating sheets 15a and 15b, and thus formed substrate 1 is sintered at a certain temperature. At this time, marks 8 are given to the substrate 1 which will help forming spiral coil patterns in a subsequent process.

Figure 3:
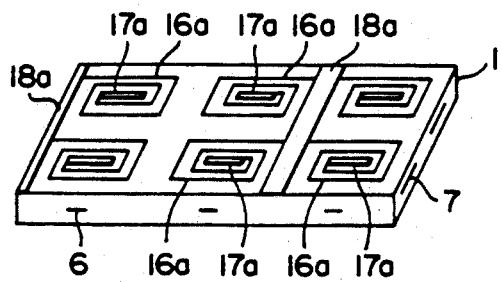
Figure 4:
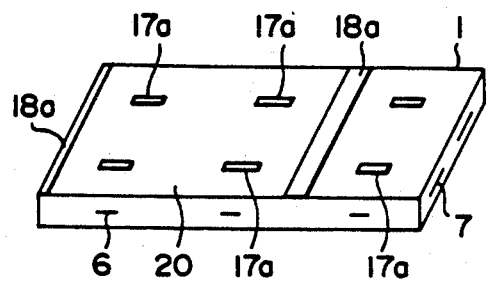

Referring to the marks 8 on the sintered substrate 1, six spiral coil patterns 16a are formed on the substrate 1 as shown in FIG. 3. In the first embodiment, the spiral coil patterns 16a are formed in a photoetching method. First, materials of Ti, Ti-Ag, and Ag are spattered over the entire upper surface of the substrate 1 in the above-mentioned order to form a conductive film having three layers. It is noted that a resin having a low dielectric constant such as polyamide resin may be coated on the substrate 1 before the conductive film is formed. With the arrangement, possible stray capacitance between the spiral coil patters 16a and the capacitor electrodes 5 can be suppressed, and the surface smoothness of the substrate 1 can be improved. Next, a photosensitive resist film is coated on the three-layered conductive film. Then the substrate 1 is subjected to processes of exposure to light, development, etching and resist film removal, and consequently as shown in FIG. 3, the spiral coil patterns 16a, rectangular connection electrodes 17a and lead electrodes 18a are formed on the substrate 1. Each of the spiral coil patterns 16a is connected to one of the connection electrode 17a on its one end and to one of the lead electrode 18a on its other end. For electrical insulation, photosensitive polyamide resin is coated on the entire upper surface of the substrate 1 on which the spiral coil patterns 16a and the others were formed. Subsequently, the substrate 1 is subjected to the processes of exposure to light, development and etching, and consequently as shown in FIG. 4, a photosensitive polyamide resin film 20 is formed to cove the entire surface of the substrate 1 except for the portions of the connection electrodes 17a and the lead electrodes 18a.

Figure 5:
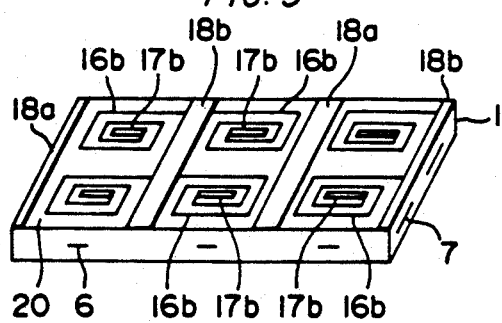
Figure 6:
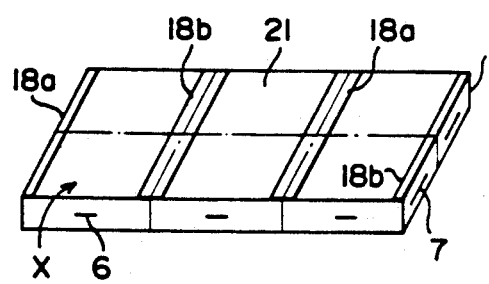
Figure 7:
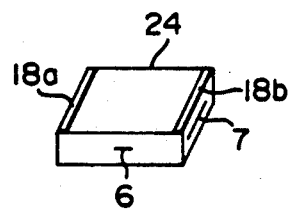

Further, by subjecting the substrate 1 to the same processes where the spiral coil patterns 16a and the others were formed, there are formed spiral coil patterns 16b, connection electrodes 17b and lead electrodes 18b as shown in FIG. 5. The spiral coil patterns 16b are connected to the respective spiral coil patterns 16a via the connection electrodes 17b and 17a so that each LC composite part produced from the substrate 1 will have an inductance L1. The substrate 1 is subjected to the same processes where the photosensitive polyamide resin film 20 was formed so that a photosensitive polyamide resin film 21 is formed for insulation to cover the entire upper surface of the substrate 1 except for the portions of the lead electrodes 18a and 18b as shown in FIG. 6. Subsequently, the substrate 1 is divided into six elements according to the chain lines as shown in FIG. 6 by slicing, laser cutting, water pressure cutting or the like to obtain LC composite parts of laminate construction (see FIG. 7). The LC composite part 24 of laminate construction shown in FIG. 7 was the portion X of the substrate 1 at the front on the left in FIG. 6 before being cut off.

Figure 8:
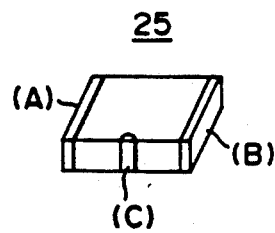
Figure 9:
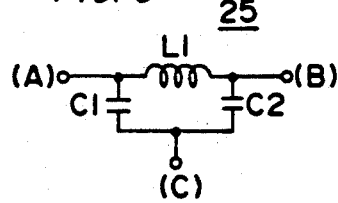

External electrodes (A), (B) and (C) are formed on the LC composite part 24 of laminate construction by printing, transfer, vaporization, plating or the like to enable the LC composite part 24 to be used as a π type noise filter (see FIG. 8). The external electrodes (A) and (B) are connected to the lead electrodes 18a and 18b of the spiral coil patterns 16a and 16b to form the inductance L1 between the external electrodes (A) and (B). Further, the external electrodes (A), (B) and (C) are connected to the capacitor electrodes 5, 7 and 6 respectively, and consequently, obtained is a π type noise filter 25 having an electrical equivalent circuit shown in FIG. 9.

Figure 10:
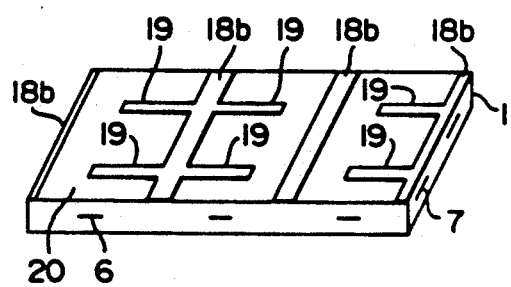

It is noted that, depending on the required value of the inductance L1, linear patterns 19 as shown in FIG. 10 may be formed instead of the spiral coil patterns 16b shown in FIG. 5. In order to increase the inductance L1 between the external electrodes (A) and (B) or the current capacity, additional spiral coil patterns may be formed on the lower surface of the substrate 1. A plurality of spiral coil patterns in a stack may be adopted. In order to increase the electrostatic capacitances C1 and C2, an additional ceramic sheet provided with capacitor electrodes may be interposed between the ceramic sheets 4a and 4b or between the ceramic sheets 4b and 4c.

SECOND EMBODIMENT: FIG. 11 THROUGH 17

Described in the second embodiment is a method of producing an L type noise filter having one spiral coil and one laminate capacitor. In this embodiment, one noise filter is produced from one substrate, but for practical mass production, a plurality of noise filters can be produced from one substrate.

FIG. 11 shows a substrate 30 in which insulating sheets 15c and 15d are laminated on the upper and lower surfaces of a capacitor section 31. The capacitor section 31 is composed of ceramic sheets 4d and 4e and capacitor electrodes 32a and 32b formed on the respective ceramic sheets 4d and 4e. In the laminate construction, an electrostatic capacitance C1 is formed between the capacitor electrode 32a and the capacitor electrode 32b. After being laminated with the insulating sheets 15c and 15d as shown in FIG. 12, the substrate 30 is sintered at a certain temperature.

Next, a spiral coil pattern 16c, a connection electrode 17c and a lead electrode 18c are formed on the sintered substrate 30. Subsequently, for insulation, a photosensitive polyamide resin film 33 is formed to cover the entire upper surface of the substrate 30 except for the portions of the connection electrode 17c and the lead electrode 18c. On the resin film 33, a spiral coil pattern 16d, a connection electrode 17d and a lead electrode 18d are formed as shown in FIG. 15. The spiral coil pattern 16d is connected to the spiral coil pattern 16c via the connection electrodes 17d and 17c so that the LC composite part will have the inductance L1. Further, a photosensitive polyamide resin film 34 is formed on the substrate 30 for insulation.

Then, on the polyamide resin film 34, external electrodes (A), (B) and (C) are formed as shown in FIG. 16 to make the processed substrate 30 into an L type noise filter. The external electrodes (B) and (C) are connected to the capacitor electrodes 32b and 32a respectively to form the electrostatic capacitance C1 between the external electrodes (B) and (C). The external electrode (A) is connected to the lead electrode 18d of the spiral coil pattern 16d to form the inductance L1 between the external electrodes (A) and (B). Consequently, obtained is an L type noise filter 35 having an electrical equivalent circuit shown in FIG. 17.

THIRD EMBODIMENT: FIG. 18 THROUGH 24

Described in the third embodiment is a method of producing a π type noise filter network including six tπ type noise filters each of which has one coil and two capacitors. In FIG. 18, a substrate 1 carries laminate capacitors corresponding to six n type noise filters. The substrate 1 is laminated with capacitor sections 2 and 3, and insulating sheets 15a and 15b are laminated on the upper surface of the capacitor section 2 and the lower surface of the capacitor section 3 respectively. In this embodiment, one LC composite network part is produced form one substrate, but for practical mass production, a plurality of LC composite network parts can be produced from one substrate.

Each of the capacitor sections 2 and 3 includes six laminate capacitors composed of ceramic sheets 4a, 4b and 4c and capacitor electrodes 5, 6 and 7 formed on the respective ceramic sheets 4a, 4b and 4c. In mass production, the ceramic sheets 4a, 4b and 4c should be large so that the substrate 1 will be large enough to be cut into some LC composite network parts after processed as described below. The capacitor electrodes 6 serve as common electrodes. In the laminate construction, an electrostatic capacitance C1 is formed between the capacitor electrodes 5 and 6, and an electrostatic capacitance C2 is formed between the capacitor electrodes 6 and 7 The electrostatic capacitances C1 and C2 constitute a capacitor network corresponding to one π type noise filter. As shown in FIG. 19, the capacitor section 2 and 3 are laminated together with the insulating sheets 15a and 15b, and the laminated substrate 1 is sintered at a certain temperature.

Next, six spiral coil patterns 16a are formed on the sintered substrate 1 as shown in FIG. 20. In this embodiment, the spiral coil patterns 16a ar formed in the photoetching method adopted in the first embodiment. For electrical insulation, photosensitive polyamide resin is coated on the entire upper surface of the substrate 1 where the spiral coil patterns 16a, connection electrodes 17a and lead electrodes 18a were formed. Subsequently, the substrate 1 is subjected to the processes of exposure to light, development and etching so that a photosensitive polyamide resin film 20 is formed to cover the entire surface of the substrate 1 except for the portions of the connection electrodes 17a as shown in FIG. 21.

Figure 22:
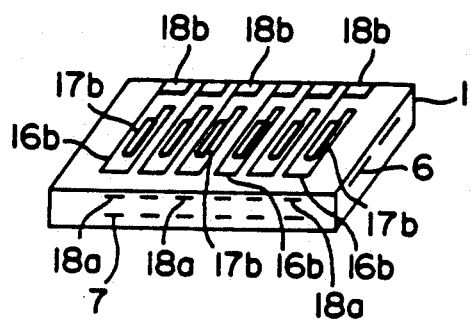

Further, the substrate 1 is subjected to the processes where the spiral coil patterns 16a and the others were formed in order to obtain spiral coil patterns 16b, connection electrodes 17b and lead electrodes 18b as shown in FIG. 22. The spiral coil patterns 16b are connected to the respective spiral coil patterns 16a via the connection electrodes 17b and 17a so that the substrate 1 will have six inductances L1. Then, the substrate 1 is subjected to the same processes where the polyamide resin film 20 was formed so that a photosensitive polyamide resin film 21 is further formed on the substrate 1.

When the substrate 1 carries a plurality of π type noise filter networks after forming the polyamide resin film 21, the substrate 1 is cut into pieces by slicing laser cutting, water pressure cutting or the like. Thus, some LC composite network parts of laminate construction are obtained.

Figure 23:
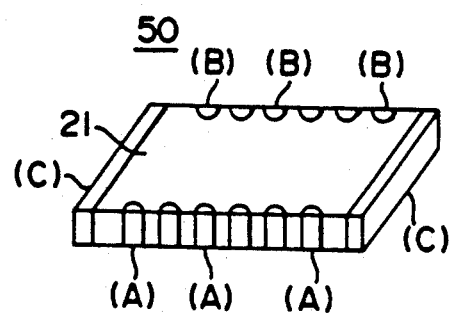
Figure 24:
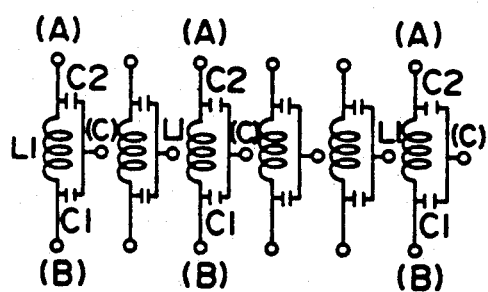

Next, external electrodes (A), (B) and (C) are formed on an LC composite network part of laminate construction by printing, transfer, vaporization, plating or the like to enable the LC composite network part to be used as a type noise filter network (see FIG. 23). The external electrodes (A) and (B) are connected to the respective lead electrodes 18a and 18b of the spiral coil patterns 16a and 16b to form the inductances L1 between the external electrodes (A) and (B). Further, the external electrodes (A), (B) and (C) are connected to the capacitor electrodes 7, 5 and 6 respectively to make the LC composite network part into a $\pi$ type noise filter network 50 having an electrical equivalent circuit shown in FIG. 24.

FOURTH EMBODIMENT: FIGS. 25 THROUGH 31

Described in the fourth embodiment is a method of producing an L type noise filter network including six L type noise filters each of which has one spiral coil and one laminate capacitor.

Figure 25:
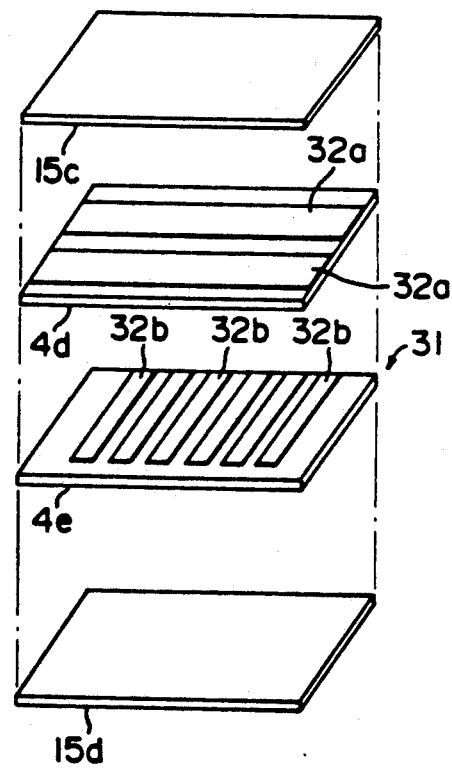

FIG. 25 shows a substrate 30 in which insulating sheets 15c and 15d are laminated on the upper and lower surfaces of a capacitor section 31. The capacitor section 31 includes six laminate capacitors, and is composed of ceramic sheets 4d and 4e and capacitor electrodes 32a and 32b formed on the respective ceramic sheets 4d and 4e. In the laminate construction, six electrostatic capacitances C1 are formed between the capacitor electrodes 32a and the capacitor electrodes 32b. The electrostatic capacitances C1 constitute a capacitor network corresponding to an L type noise filter network. The capacitor section 31 is laminated with insulating sheets 15c and 15d as shown in FIG. 26, and then the laminated substrate 30 is sintered at a certain temperature.

Next, six spiral coil patterns 16c, connection electrodes 17c and lead electrodes 18c are formed on the sintered substrate 30 as shown in FIG. 27. Subsequently, for insulation, a photosensitive polyamide resin film 33 is formed to cover the entire upper surface of the substrate 30 except for the portions of the connection electrodes 17c. Further, on the polyamide resin film 33, spiral coil patterns 16d, connection electrodes 17d and lead electrodes 18d are formed as shown in FIG. 29. The spiral coil patterns 16d are connected to the respective spiral coil patterns 16c via the connection electrodes 17d and 17c so that the substrate 30 will have six inductances L1. Then, for insulation, a photosensitive polyamide resin film 34 is formed on the substrate 30.

External electrodes (A), (B) and (C) are formed on the polyamide resin film 34 to enable the LC composite network part to be used as an L type noise filter network (see FIG. 30). The external electrodes (B) and (C) are connected to the respective capacitor electrodes 32b and 32a to form electrostatic capacitances C1 between the external electrodes (B) and (C). The external electrodes (A) are connected to the respective lead electrodes 18c of the spiral coil patterns 16c, and the external electrodes (B) are connected to the respective lead electrodes 18d of the spiral coil patterns 16d to form the inductances L1 between the external electrodes (A) and (B). Consequently, obtained is an L type noise filter network 51 having an electrical equivalent circuit shown in FIG. 31.

OTHER EMBODIMENTS

Although a method of laminating sheets on a capacitor section is adopted in the four embodiments above, a method of alternatively laminating ceramic materials and capacitor electrode materials by printing may be adopted instead. Also, although the photoetching method is applied to forming each coil section in the embodiments, a sheet laminating method or a printing method may be applied instead.

Figure 32:
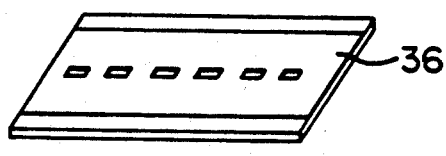
FIGS. 32, 33, 34, 35, 36 and 37 are perspective views of a ceramic sheet showing modifications of a capacitor electrode.
Figure 33:
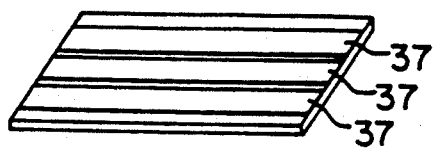
Figure 34:
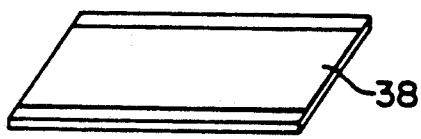
Figure 35:
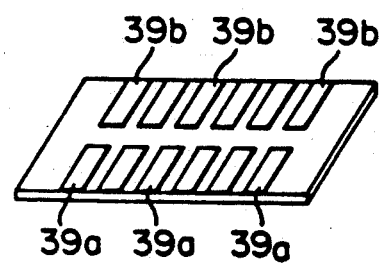
Figure 36:
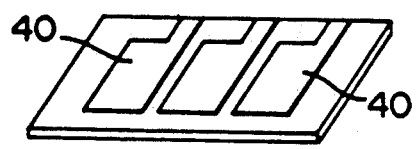
Figure 37:
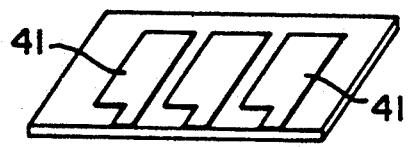

The configuration of each capacitor is arbitrary. For instance, even when a capacitor electrode 36, 37 or 38 shown in FIGS. 32, 33 and 34 is used instead of the capacitor electrode 6 shown in FIG. 18 or the capacitor electrode 32a shown in FIG. 32a, or when capacitor electrodes 39a and 39b shown in FIG. 35 are used instead of the capacitor electrodes 5 and 7 shown in FIG. 18, the same effect will be achieved. Further, when capacitor electrodes 40 and 41 shown in FIGS. 36 and 37 are used instead of the capacitor electrodes 5 and 7 shown in FIG. 18, or when either the capacitor electrodes 40 or 41 are used instead of the capacitor electrodes 32b shown in FIG. 25, cross-talk will be suppressed.

In the embodiments, the capacitor electrodes are electrically connected with the spiral coil patterns via the external electrodes in each LC network part, but the capacitor electrodes may be connected with the spiral coil patterns through holes.

Although the present invention has been described in connection with the preferred embodiments thereof, it is to be noted that various changes and modifications are apparent to those who are skilled in the art. Such changes and modifications are to be understood as included within the scope of the present invention as defined by the appended claims.

What is claimed is:

1. A method of producing an LC composite part, comprising the steps of:
    forming a substrate having a capacitor section including a plurality of capacitor units by laminating ceramic sheets having capacitor electrode layers formed thereof such that said capacitor electrode layers and said ceramic sheets alternate;
    sintering the substrate;
    forming a coil section including a plurality of spiral coil patterns on the sintered substrate by a thin film forming method;
    dividing the laminated substrate having the capacitor section and the coil section into LC composite parts; and
    connecting the capacitor electrode with the spiral coil pattern by electrical connection means in each of the LC composite parts.

2. A method of producing an LC composite part as claimed in claim 1, wherein coil patterns are formed on the sintered substrate following the steps of:
    forming a conductive film on an entire upper surface of the sintered substrate by the thin film forming method;
    forming on the conductive film a resist film corresponding to the coil patterns;
    etching the conductive film; and
    removing the resist film.

3. A method of producing an LC composite part as claimed in claim 2, wherein the coil patterns formed on the sintered substrate are covered with a resin which has a low dielectric constant.

4. A method of producing an LC composite part as claimed in claim 3, wherein spiral coil patterns are layered on the sintered substrate by repeating a step of forming coil patterns on the sintered substrate and a step of covering the coil patterns with a resin which has a low dielectric constant.

5. A method of producing an LC composite part as claimed in claim 4, wherein said step of forming the substrate includes laminating the substrate with at least one ceramic sheet having no electrode layer formed thereon to cover at least one ceramic sheet having an exposed capacitor electrode layer formed thereon.

6. A method of producing an LC composite part as claimed in claim 4, wherein said step of forming the substrate includes laminating the substrate with a plurality of ceramic sheets having capacitor electrode layers formed thereon, said plurality of sheets being formed between ceramic sheets having no electrode layer formed thereon.

7. A method of producing an LC composite network part, comprising the steps of:
   forming a substrate having a capacitor section including a plurality of capacitor networks by laminating ceramic sheets having capacitor electrode layers formed thereon such that said capacitor electrode layers and said ceramic sheets alternate;
   sintering the substrate;
   forming a coil section having a coil network including a plurality of spiral coil patterns on the sintered substrate by a thin film forming method;
   dividing the laminated substrate having the capacitor section and the coil section into LC composite network parts; and
   connecting the capacitor electrode with the spiral coil pattern by electrical connection means in each of the LC composite network parts.

8. A method of producing an LC composite network part as claimed in claim 7, wherein coil patterns are formed on the sintered substrate following the steps of:
   forming a conductive film on an entire upper surface of the sintered substrate by the thin film forming method;
   forming on the conductive film a resist film corresponding to the coil patterns;
   etching the conductive film; and
   removing the resist film.

9. A method of producing an LC composite network part as claimed in claim 8, wherein the coil patterns formed on the sintered substrate are covered with a resin which has a low dielectric constant.

10. A method of producing an LC composite network part as claimed in claim 9, wherein spiral coil patterns are layered on the sintered substrate by repeating a step of forming coil patterns on the sintered substrate and a step of covering the coil patterns with a resin which has a low dielectric constant.

11. A method of producing an LC composite part as claimed in claim 10, wherein said step of forming the substrate includes laminating the substrate with at least one ceramic sheet having no electrode layer formed thereon to cover at least one ceramic sheet having an exposed capacitor electrode layer formed thereon.

12. A method of producing an LC composite part as claimed in claim 11, wherein said step of forming the substrate includes laminating the substrate with a plurality of ceramic sheets having capacitor electrode layers formed thereon, said plurality of sheets being formed between ceramic sheets having no electrode layer formed thereon.

13. A method of producing an LC part, comprising the steps of:
   forming a substrate having a capacitor section including a plurality of capacitor units by laminating ceramic sheets having capacitor electrode layers formed thereon such that said capacitor electrode layers and said ceramic layers alternate, and by laminating the capacitor section with a ceramic sheet having no electrode layer formed thereon to cover exposed capacitor electrode layers;
   sintering the substrate;
   forming a coil section including a plurality of spiral coil patterns on the sintered substrate by a thin film forming method;
   dividing the laminated substrate having the capacitor section and the coil section into LC composite parts; and
   connecting the capacitor electrode with the spiral coil pattern by electrical connection means in each of the LC composite parts.

14. A method of producing an LC composite part as claimed in claim 13, wherein coil patterns are formed on the sintered substrate following the steps of:
   forming a conductive film on an entire upper surface of the sintered substrate by the thin film forming method;
   forming on the conductive film a resist film corresponding to the coil patterns;
   etching the conductive film; and
   removing the resist film.

15. A method of producing an LC composite part as claimed in claim 14, wherein the coil patterns formed on the sintered substrate are covered with a resin which has a low dielectric constant.

16. A method of producing an LC composite part as claimed in claim 15, wherein spiral coil patterns are layered on the sintered substrate by repeating a step of forming coil patterns on the sintered substrate and a step of covering the coil patterns with a resin which has a low dielectric constant.

* * * * *